(12) United States Patent
Jung et al.

(10) Patent No.: US 7,629,595 B2
(45) Date of Patent: Dec. 8, 2009

(54) METHOD FOR FABRICATING SEMICONDUCTOR DEVICE

(75) Inventors: Jae Chang Jung, Seoul (KR); Chang Moon Lim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/609,879

(22) Filed: Dec. 12, 2006

(65) Prior Publication Data

US 2007/0164235 A1 Jul. 19, 2007

(30) Foreign Application Priority Data

Jan. 13, 2006 (KR) .................. 10-2006-0003919

(51) Int. Cl.
*G03F 7/26* (2006.01)
(52) U.S. Cl. ............. 250/492.2; 438/637; 257/E21.026
(58) Field of Classification Search ............. 250/492.1; 438/637; 257/E21.026
See application file for complete search history.

(56) References Cited

U.S. PATENT DOCUMENTS

| | | | |
|---|---|---|---|
| 6,103,450 A * | 8/2000 | Choi | 430/270.1 |
| 6,255,041 B1 * | 7/2001 | Oomori et al. | 430/322 |
| 6,472,126 B1 * | 10/2002 | Traver et al. | 430/321 |
| 6,645,851 B1 * | 11/2003 | Ho et al. | 438/626 |
| 2002/0048723 A1 * | 4/2002 | Lee et al. | 430/270.1 |
| 2005/0153466 A1 * | 7/2005 | Choi et al. | 438/14 |
| 2006/0246382 A1 * | 11/2006 | Lee et al. | 430/331 |

FOREIGN PATENT DOCUMENTS

KR 1020040001845 A 1/2004

OTHER PUBLICATIONS

KIPO, Notice of Rejection, Application No. 10-2006-0003919, May 8, 2008.

* cited by examiner

*Primary Examiner*—David P Porta
*Assistant Examiner*—Marcus H Taningco
(74) *Attorney, Agent, or Firm*—Townsend and Townsend and Crew LLP

(57) ABSTRACT

A method for forming a fine photoresist pattern of a semiconductor device, the method comprising the steps of forming a chemically amplified photoresist film over an underlying layer formed over a semiconductor substrate to form a first photoresist pattern; exposing the first photoresist pattern without exposure mask to bake the resulting structure; and flowing the photoresist of the first photoresist pattern to obtain a second photoresist pattern.

4 Claims, 3 Drawing Sheets

METHOD FOR FABRICATING SEMICONDUCTOR DEVICE

CROSS-REFERENCES TO RELATED APPLICATIONS

The present application claims priority to Korean patent application number 10-2006-0003919, filed on Jan. 13, 2006, which is incorporated by reference in its entirety.

BACKGROUND OF THE INVENTION

The present invention relates to a method for fabricating a semiconductor device, and more specifically to a method for forming a high resolution photoresist pattern.

In order to form a contact hole pattern beyond the resolution limit of an exposer, the pattern is heated above the glass transition temperature of the photoresist after a contact hole pattern is formed, so as to flow the photoresist and make the contact hole smaller. However, the contact holes near the center of the wafer tends to become relatively be smaller than other parts of the wafer. This could decrease the yield, thereby increasing the production cost of the device.

BRIEF SUMMARY OF THE INVENTION

Various embodiments of the present invention are directed to a semiconductor device having a fine resolution photoresist pattern, below the resolution limit of an exposer. According to one embodiment, the pattern is a contact hole pattern. In another embodiment, a method for forming a pattern below the resolution limit of an exposer comprises exposing the pattern with Deep Ultra Violet (DUV) light before the baking step, preventing the hole size in the central portion of the wafer from being smaller than other portions.

DETAILED DESCRIPTION OF THE SPECIFIC EMBODIMENT

Figure 1A:
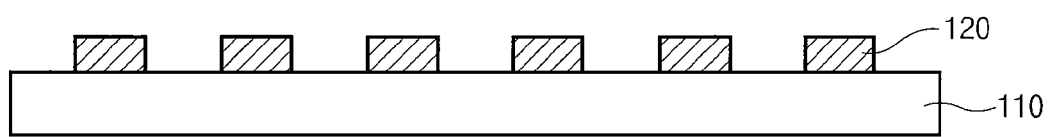
FIG. 1a and FIG. 1b illustrate the changes of a contact hole size before and after the resist flow process without re-exposure of the first photoresist pattern.
Figure 1B:
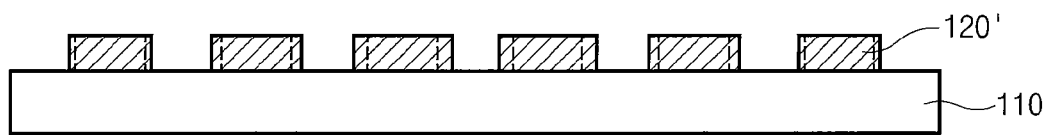
Figure 2A:
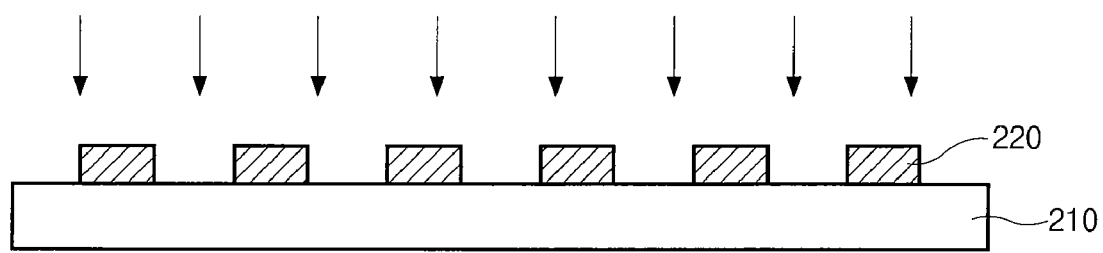
FIG. 2a and FIG. 2b illustrate the changes of a contact hole size before and after the resist flow process with re-exposure of the first photoresist pattern.
Figure 2B:
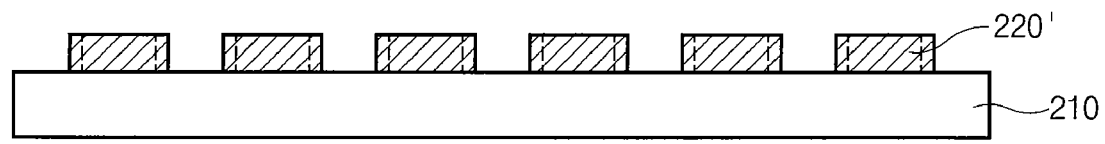

The present invention will be described in detail with reference to the accompanying drawings.

The present invention relates to a method for forming a fine photoresist pattern of a semiconductor device beyond the resolution limit of an exposer. The method of the present invention improves the physical properties of a photoresist film. The method makes the flow rate of a photoresist uniform regardless of the position on the wafer during a resist flow process, thereby improving the yield of the semiconductor device.

In an embodiment of the invention, a method for forming a fine (or high resolution) photoresist pattern of a semiconductor device comprises the steps of forming a chemically amplified photoresist film over an underlying layer formed over a semiconductor substrate to form a first photoresist pattern; exposing the first photoresist pattern without an exposure mask to source light; baking the resulting structure; and performing a photoresist flow process onto the first photoresist pattern to obtain a second photoresist pattern.

Any light sources having a wavelength of 400 nm or less can be used as an exposure light during the exposing step. The light source may be selected from a group consisting of ArF (193 nm), KrF (248 nm), Extreme Ultra Violet (EUV), Vacuum Ultra Violet (VUV, 157 nm), E-beam, X-ray and ion-beam. The exposing step may be performed with an exposure energy ranging from 1 to 100 mJ/cm$^2$. In making the first photoresist pattern, a baking step is performed at a temperature below the glass transition temperature of the photoresist in order not to flow the photoresist. The baking time can be regulated enough to improve the physical properties of the photoresist by the generation of carboxylic acid during the exposing step. The baking time may vary depending on the baking temperature of the photoresist. For example, when the photoresist has a glass transition temperature of 150° C., the baking step may be performed at 100~149° C. for 30~120 seconds, preferably at 120° C. for 90 seconds.

Generally, chemically amplified ArF photoresist has an acid-labile protecting group. In the method of the present invention, any of the chemically amplified photoresist materials having a carboxylic acid by detaching the protecting group can be used. Examples of the photoresist materials include a Ring-Opened Maleic Anhydride (ROMA)-type photoresist comprising a ROMA-type polymer or a photoresist comprising a metacrylate or acrylate polymer. A hybrid type photoresist comprising the above-mentioned polymer(s) mixed with copolymer of cycloolefin and maleic anhydride (COMA) can also be used. The hybrid type copolymer may further comprise a cycloolefin copolymer. In this embodiment of the present invention, a ROMA-type ArF photoresist, A52T3 photoresist (Kumho Petrochemical, Korea), is used.

When a first photoresist pattern is re-exposed with DUV light before the resist flowing step, an acid-labile protecting group of the chemically amplified positive photoresist is detached. This increases the carboxylic acid components in the photoresist resin, thereby changing the photoresist from hydrophobic to hydrophilic. If the amount of carboxylic acid components is increased, flowing properties are improved. This makes the line-width of the pattern shrink uniformly throughout the entire wafer, thereby improving the uniformity of the pattern. The improvement in uniformity is especially remarkable in case of contact hole patterns.

The photoresist flow process is performed over the glass transition temperature of photoresist. For example, when the photoresist has a glass transition temperature of 150° C., the flowing step is performed at 150~170° C. for 30~120 seconds, preferably at 154° C. for 30~120 seconds, more preferably for 60 seconds. When the flowing step is performed for 30 seconds or less, the amount of flowed photoresist becomes insufficient. When the flowing step is performed for 120 seconds or more, the time becomes longer, which decreases productivity.

REFERENCE EXAMPLE

Formation of a First Contact Hole Pattern

Figure 3:
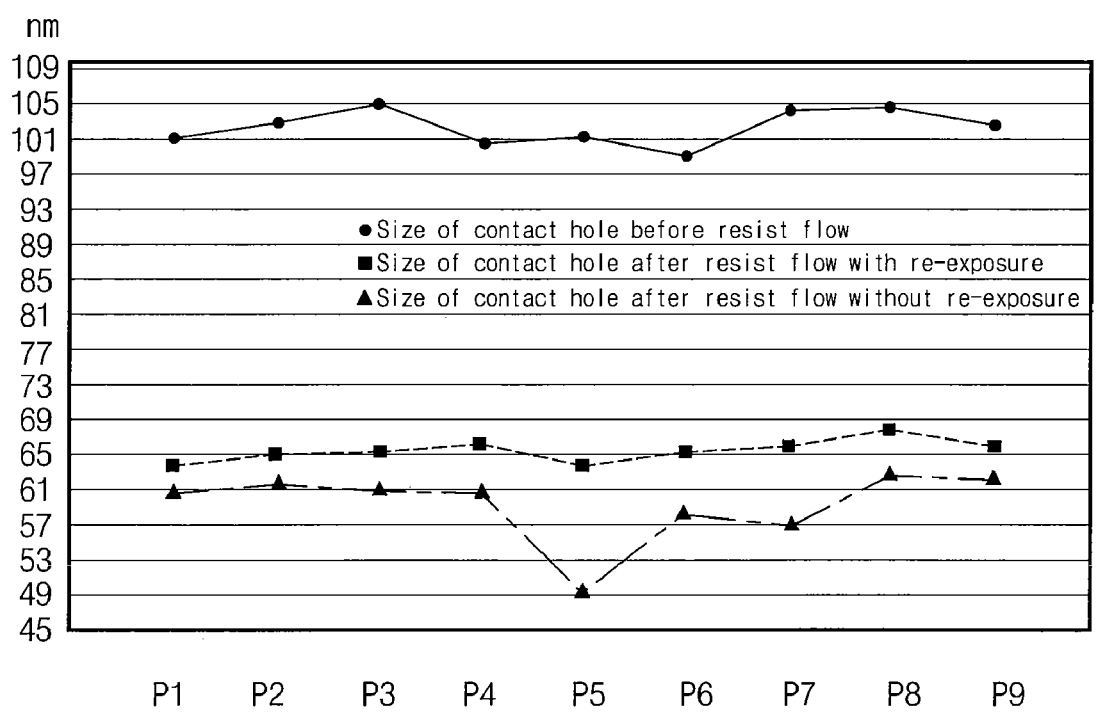
FIG. 3 is a graph illustrating the changes of a contact hole size before and after flowing a resist pattern.

After A52T3 photoresist (Kumho Petrochemical, Korea, glass transition temperature: 141° C.) was coated to a thickness of 250 nm onto a semiconductor substrate (110), the photoresist was soft-baked at 110° C. for 90 seconds. After soft-baking, the resulting structure was exposed with an ArF exposer (XT: 1400E produced by ASML Co.) and post-baked for 90 seconds. After post-baking, the resulting structure was developed with 2.35 wt % tetramethyl ammonium hydroxide (TMAH) solution to obtain a first contact hole pattern (120). When 9 separate points on the wafer from leftward to rightward were measured, the size of the contact hole ranged 100 to 105 nm (see ● of FIG. 3).

EXAMPLE

Formation of a Second Contact Hole Pattern after Re-Exposure

After the first contact hole pattern (220) obtained from "Reference Example" was re-exposed using the ArF exposer without any exposure mask, the pattern was baked at 120° C. for 90 seconds. Then, the wafer was re-baked at 154° C. for 60 seconds to flow the photoresist of the contact hole pattern, thereby obtaining a second contact hole pattern (220'). When 9 separate points on the wafer from leftward to rightward were measured, the size of the second contact hole ranged from 64 to 68 nm (see ■ of FIG. 3). That is, the second contact hole was smaller than the first contact hole by about 40 nm while maintaining the uniform size regardless of the location on the wafer.

COMPARATIVE EXAMPLE

Formation of a Second' Contact Hole Pattern without Re-Exposure

The first contact hole pattern (120) obtained from "Reference Example" was baked at 154° C. for 60 seconds without any re-exposure step to flow the pattern, thereby obtaining a second' contact hole pattern (120'). When 9 separate points on the wafer from leftward to rightward were measured, the second' contact hole also shrank and ranged from 49 to 61 nm (see ▲ of FIG. 3). However, the second' contact hole on the center portion of the wafer was shown to be 49 nm, which was smaller than other 8 sites by about 10 nm.

The above embodiments of the present invention are intended only to be illustrative and not be limitative. Various alternatives and equivalents are also possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the spirit and scope of the appended claims.

What is claimed is:

1. A method for forming a fine photoresist pattern of a semiconductor device, the method comprising:
    forming a chemically amplified photoresist film over a layer formed over a semiconductor substrate;
    performing a lithography process on the chemically amplified photoresist film to form a first photoresist pattern, wherein contact holes are defined in the first photoresist pattern;
    exposing the first photoresist pattern using a source light, wherein the first photoresist pattern is exposed without using an exposure mask to block the source light;
    performing a first baking process on the first photoresist pattern; and
    performing a photoresist flow process on the first photoresist pattern to transform the first photoresist pattern into a second photoresist pattern, the photoresist flow process comprising a second baking process, wherein a width of the contact holes in the second photoresist pattern are reduced relative to a width of the contact holes in the first photoresist pattern.

2. The method according to claim 1, wherein the source light is selected from the group consisting of KrF, ArF and VUV.

3. The method according to claim 1, wherein the first baking process is performed below a glass transition temperature of photoresist.

4. The method according to claim 1, wherein the second baking process is performed over the glass transition temperature of photoresist.

* * * * *